United States Patent
Nawata

(10) Patent No.: US 8,406,049 B2
(45) Date of Patent: Mar. 26, 2013

(54) NONVOLATILE SEMICONDUCTOR MEMORY DEVICE AND WRITING METHOD THEREOF

(75) Inventor: Hidefumi Nawata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 13/020,401

(22) Filed: Feb. 3, 2011

(65) Prior Publication Data

US 2012/0020160 A1    Jan. 26, 2012

(30) Foreign Application Priority Data

Jul. 21, 2010   (JP) .................................. 2010-164265

(51) Int. Cl.
 *G11C 11/34* (2006.01)
 *G11C 16/04* (2006.01)
(52) U.S. Cl. .............................. 365/185.02; 365/185.24
(58) Field of Classification Search ......... 365/185.02 O, 365/185.03, 185.11, 185.24 X, 185.29, 185.33, 365/185.02, 185.24
 See application file for complete search history.

(56) References Cited

U.S. PATENT DOCUMENTS 6,870,773 B2 * 3/2005 Noguchi et al. .......... 365/185.22
7,701,765 B2 * 4/2010 Aritome ................... 365/185.12

FOREIGN PATENT DOCUMENTS

JP       2004-192789       7/2004

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A control circuit is configured to execute a writing operation for giving a second threshold voltage distribution to a plurality of memory cells formed along one word line. In the writing operation, the control circuit performs a writing operation by executing a voltage applying operation in memory cells to be given the second threshold voltage distribution. While the control circuit executes a voltage applying operation in memory cells to be maintained in an erased state, thereby moving a first threshold voltage distribution to a positive direction to obtain a third threshold voltage distribution representing the erased state.

17 Claims, 13 Drawing Sheets

First Embodiment

Upper Page Data Writing (First Embodiment)

NONVOLATILE SEMICONDUCTOR MEMORY DEVICE AND WRITING METHOD THEREOF

CROSS REFERENCE TO RELATED APPLICATIONS

This application is based on and claims the benefit of priority from prior Japanese Patent Application No. 2010-164265, filed on Jul. 21, 2010, the entire contents of which are incorporated herein by reference.

BACKGROUND

1. Field

Embodiments described herein relate generally to an electrically-rewritable nonvolatile semiconductor memory device and a writing method thereof.

2. Description of the Related Art

There is a rapid increase in demand for NAND type flash memory along with increase of mobile device applications that process large-size data such as images, motion pictures, etc. Especially, by employing a multi-value storage technique that enables information of two bits or more to be stored in one memory cell, NAND type flash memory has become able to store more information with a smaller chip area.

In a highly-integrated flash memory with a high degree of miniaturization of cells, data threshold distributions are influenced by interference between adjoining cells. Particularly, when a multi-value storage scheme is employed, the width of data threshold distributions and the interval between the distributions are set smaller than those of a two-value storage scheme. Therefore, interference between adjoining cells greatly influences data reliability.

DETAILED DESCRIPTION

Figure 1:
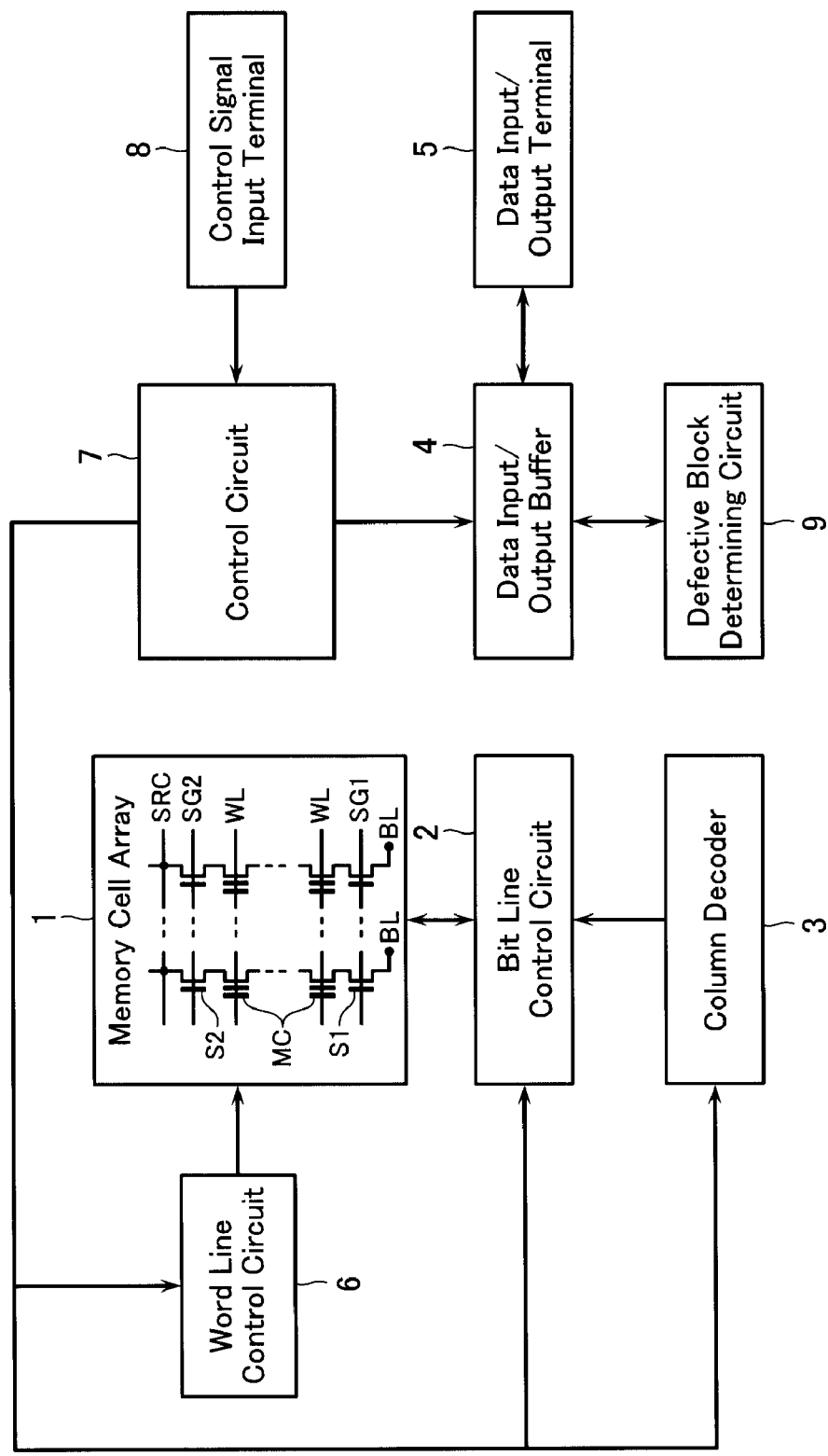
FIG. 1 is a configuration diagram showing a schematic configuration of a nonvolatile semiconductor memory device (NAND cell type flash memory) according to a first embodiment.

A nonvolatile semiconductor memory device according to one embodiment includes a memory cell array, a plurality of word lines, a plurality of bit lines, a source line, and a control circuit. The memory cell array is configured by a plurality of memory strings. Each memory string includes memory cells connected in series. Each memory cell is capable of storing data by retaining a first threshold voltage distribution having a negative upper limit value and representing an erased state after data is erased, and a second threshold voltage distribution having a lower limit value higher than the upper limit value of the first threshold voltage distribution and representing a written state after data is written. The plurality of word lines are each provided to be connected commonly to the memory cells in the plurality of memory strings. The plurality of bit lines are connected to first ends of the memory strings respectively. The source line is connected to second ends of the memory strings. The control circuit controls the memory cells through the word lines, the bit lines, and the source line. A control circuit is configured to execute a writing operation for giving a second threshold voltage distribution to a plurality of memory cells formed along one word line. In the writing operation, the control circuit performs a writing operation by executing a voltage applying operation in memory cells to be given the second threshold voltage distribution. While the control circuit executes a voltage applying operation in memory cells to be maintained in an erased state, thereby moving a first threshold voltage distribution to a positive direction to obtain a third threshold voltage distribution representing the erased state A nonvolatile semiconductor memory device according to one embodiment includes a memory cell array, a plurality of word lines, a plurality of bit lines, a source line, and a control circuit. The memory cell array is configured by a plurality of memory strings. Each memory string includes memory cells connected in series. Each memory cell is capable of storing data by retaining a first threshold voltage distribution having a negative upper limit value and representing an erased state after data is erased, and a second threshold voltage distribution having a lower limit value higher than the upper limit value of the first threshold voltage distribution and representing a written state after data is written. The plurality of word lines are each provided to be connected commonly to the memory cells in the plurality of memory strings. The plurality of bit lines are connected to first ends of the memory strings respectively. The source line is connected to second ends of the memory strings. The control circuit controls the memory cells through the word lines, the bit lines, and the source line. After completing an operation for writing the second threshold voltage distribution in the memory cell array, the control circuit is configured to perform a control of executing a voltage applying operation selectively in memory cells given the first threshold voltage distribution. Thereby, the control circuit moves the first threshold voltage distribution in memory cells to be maintained in the erased state to a positive direction to obtain a third threshold voltage distribution representing the erased state.

In a writing method of a nonvolatile semiconductor memory device according to one embodiment, the nonvolatile semiconductor memory device includes a memory cell array, a plurality of word lines, a plurality of bit lines, and a source line. The memory cell array is configured by a plurality of memory strings. Each memory string includes memory cells connected in series. Each memory cell is capable of storing data by retaining a first threshold voltage distribution having a negative upper limit value and representing an erased state after data is erased and a second threshold voltage distribution having a lower limit value higher than the upper limit value of the first threshold voltage distribution and representing a written state after data is written. The plurality of word lines are each provided to be connected commonly to the memory cells in the plurality of memory strings. The plurality of bit lines are connected to first ends of the memory strings respectively. The source line is connected to second ends of the memory strings. When executing a writing operation for giving the second threshold voltage distribution to a plurality of memory cells formed along one word line, the writing method performs a writing operation by executing a voltage applying operation in memory cells to be given the second threshold voltage distribution. Meanwhile, the writing method executes a voltage applying operation in memory cells to be maintained in the erased state. Thereby, the writing method moves the first threshold voltage distribution to a positive direction to obtain a third threshold voltage distribution representing the erased state.

Next, a nonvolatile semiconductor memory device according to the embodiments will be explained with reference to the drawings.

[First Embodiment]
[Configuration]

FIG. 1 shows a configuration of a nonvolatile semiconductor memory device according to the first embodiment employing a four-value storage scheme (a NAND cell type flash memory employing a four-value writing scheme). The nonvolatile semiconductor memory device includes a memory cell array 1 configured by a matrix formation of memory cells MC for storing data. The memory cell array 1 includes a plurality of bit lines BL, a plurality of word lines WL, a source line SRC, and a plurality of memory cells MC. The memory cells MC are electrically data-rewritable, and arranged in a matrix formation at the intersections of the bit lines BL and the word lines WL.

A bit line control circuit 2 configured to control the voltage of the bit lines BL and a word line control circuit 6 configured to control the voltage of the word lines WL are connected to the memory cell array 1. That is, the bit line control circuit 2 reads data from the memory cells MC in the memory cell array 1 through the bit lines BL, and executes writing into the memory cells MC in the memory cell array 1 by applying a control voltage to the memory cells MC through the bit lines BL.

A column decoder 3, a data input/output buffer 4, and a data input/output terminal 5 are connected to the bit line control circuit 2. Data in the memory cells MC read out from the memory cell array 1 is externally output through the data input/output terminal 5. Write data, which is externally input to the data input/output terminal 5, is input to the bit line control circuit 2 by the column decoder 3, and written into a designated memory cell MC.

The memory cell array 1, the bit line control circuit 2, the column decoder 3, the data input/output buffer 4, and the word line control circuit 6 are connected to a control circuit 7. The control circuit 7 generates control signals for controlling the bit line control circuit 2, the column decoder 3, the data input/output buffer 4, and the word line control circuit 6, in accordance with a control signal input to a control signal input terminal 8. A defective block determining circuit 9 configured to determine whether a read-target block is a defective block or not based on read-out data is connected to the data input/output buffer 4.

Figure 2:
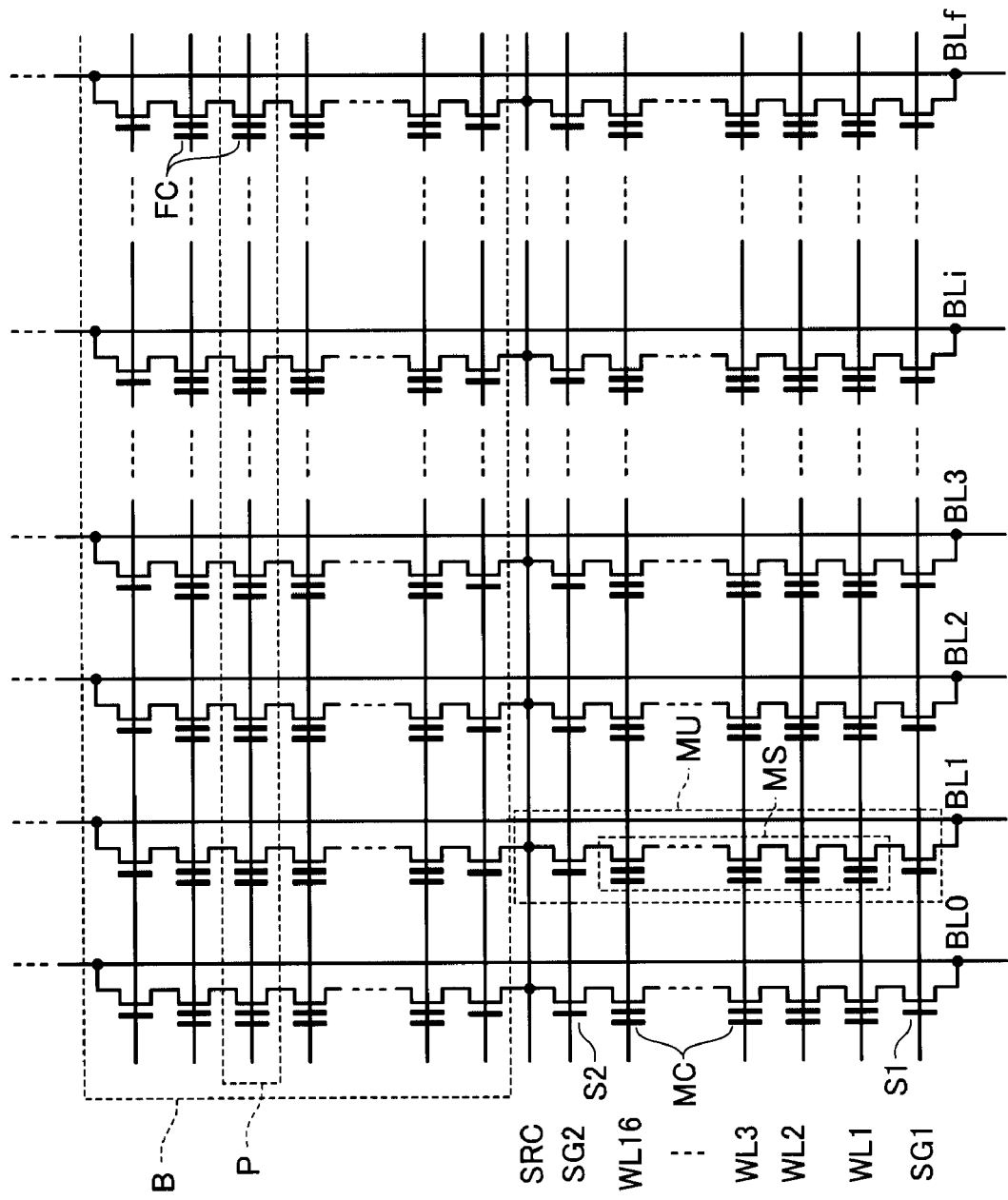
FIG. 2 is a circuit diagram showing a configuration of a memory cell array 1 shown in FIG. 1.

FIG. 2 shows a configuration of the memory cell array 1 shown in FIG. 1. As shown in FIG. 2, the memory cell array 1 is configured by a plurality of blocks B. In the memory cell array 1, data are erased on the basis of the block B (block-basis erase process).

As shown in FIG. 2, the block B is configured by a plurality of memory units MU. One memory unit MU is configured by a memory string MS including, for example, sixteen memory cells MC (EEPROM) connected in series, and first and second select transistors S1 and S2 connected to both ends of the memory string MS respectively. One end of the first select transistor S1 is connected to the bit line BL, and one end of the second select transistor S2 is connected to the source line SRC. Control gates of memory cells MC arranged in line in a row direction are connected commonly to any of the word lines WL1 to WL16. Control gates of the first select transistors S1 arranged in line in the row direction are connected commonly to a select line SG1, and control gates of the second select transistors S2 arranged in line in the row direction are connected commonly to a select line SG2.

An aggregate P of a plurality of memory cells MC connected to one word line WL configures one page or a plurality of pages. Data are written or read out on the basis of each aggregate P. A flag cell FC configured to store flag data FLAG is connected to each word line WL. Flag data FLAG stored in the flag cell FC is set to "1" when a process of writing lower page data in the memory cells MC is completed, and "0" when a process of writing upper page data in the memory cells MC is completed.

[Writing Scheme]

Next, an outline of a writing scheme of the nonvolatile semiconductor memory device will be explained. The nonvolatile semiconductor memory device is configured such that the threshold voltage of each memory cell MC can have four distributions.

Figure 3:
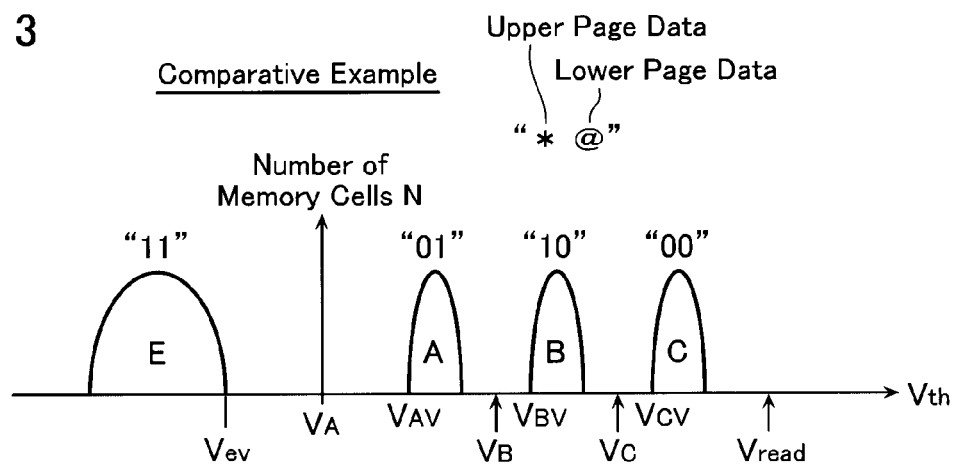
FIG. 3 shows an example of write data in a four-value storage type flash memory.

First, before explaining the first embodiment, a writing scheme of a nonvolatile semiconductor memory device according to a comparative example will be explained. FIG. 3 shows a relationship between two-bit four-value data (data "11", "10", "01", and "00") to be stored in the memory cell MC of the nonvolatile semiconductor memory device according to the comparative example, and the threshold voltage distributions of the memory cell MC. In FIG. 3, the voltages VA, VB, and VC are the voltages to be applied to a selected word line WL when reading the four types of data, while the voltages VAV, VBV, and VCV are verify voltages to be applied in an operation of writing the threshold voltage distributions A, B, and C, in order to verify whether the writing has been completed or not. The voltage Vread is a read voltage that is applied to unselected memory cells MC in the memory strings MS in a data read operation and makes the unselected memory cells MC conductive regardless of the retained data. The voltage Vev is an erase verify voltage to be applied in an operation of erasing data from memory cells MC, in order to verify whether the erase has been completed or not, and has a negative value. The relationship of level among the voltages is $Vev<VA<VAV<VB<VBV<VC<VCV<Vread$.

Though the erase verify voltage Vev is a negative value as described above, the voltage to be actually applied to the control gates of the memory cells MC in an erase verify operation needs not be a negative value, but may be zero or a positive value. That is, in an actual erase verify operation, a positive voltage is supplied to the back gates of the memory cells MC, while a zero voltage or a voltage having a positive value smaller than the voltage to the back gates is applied to the control gates of the memory cells MC. In other words, the erase verify voltage Vev is a voltage having a negative value equivalently.

The threshold voltage distribution E of the memory cells MC after block-basis erase is entirely negative up to its upper limit value, and is assigned data "11". The memory cells MC having data "01", "10", and "00" representing a written state have positive threshold voltage distributions A, B, and C respectively (the lower limit values of A, B, and C are also positive values). The threshold voltage distribution A assigned the data "01" has the lowest voltage value. The threshold voltage distribution C assigned the data "00" has the highest voltage value. The threshold voltage distribution B assigned the data "10" has a voltage value lying between the data "01" and the data "00". The threshold voltage distributions shown in FIG. 3 are a mere example. Therefore, though it is explained in FIG. 3 that all of the threshold voltage distributions A, B, and C are positive threshold voltage distributions, the threshold voltage distribution A may be a negative voltage distribution and the threshold voltage distributions B and C are positive voltage distributions. It is only necessary that the threshold voltage distribution E be a negative voltage distribution.

As shown in FIG. 3, two-bit data in one memory cell MC is made up of lower page data and upper page data. The lower page data and the upper page data are written into a memory cell MC in separate data writing operations, i.e., two data writing operations. When data is represented as "*@", "*" represents the upper page data, while "@" represents the lower page data.

Figure 4:
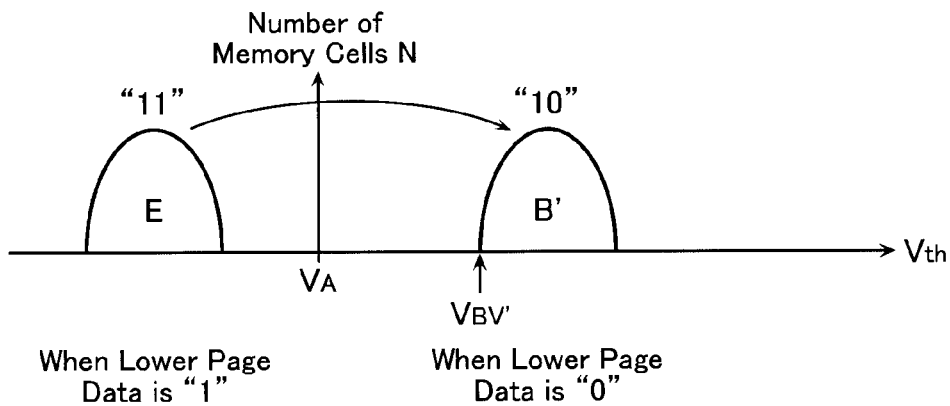
FIG. 4 is a conceptual diagram showing a data writing procedure of a four-value storage type flash memory.

Next, lower page data writing will be explained with reference to FIG. 4. In FIG. 4, it is assumed that all the memory cells MC have the threshold voltage distribution E representing the erased state and store data "11". As shown in FIG. 4, when lower page data writing is executed, the threshold voltage distribution E of the memory cells MC is set to two threshold voltage distributions (E, B') dividedly in accordance with the value of the lower page data ("1" or "0"). That is, when the value of the lower page data is "1", the threshold voltage distribution E representing the erased state is maintained.

On the other hand, when the value of the lower page data is "0", a high electrical field is applied to the tunnel oxide film of the memory cells MC to inject electrons into the floating gate electrode and raise the threshold voltage Vth of the memory cells MC by a certain amount. Specifically, with a verify potential VBV' set, injection of electrons is repeated until the threshold voltage of the memory cells MC becomes equal to or higher than this verify voltage VBV'. As a result, the memory cells MC change to a written state (data "10").

Next, upper page data writing will be explained with reference to FIG. 5. Upper page data writing is executed based on write data (upper page data) that is externally input to the chip, and the lower page data already written in the memory cells MC.

Figure 5:
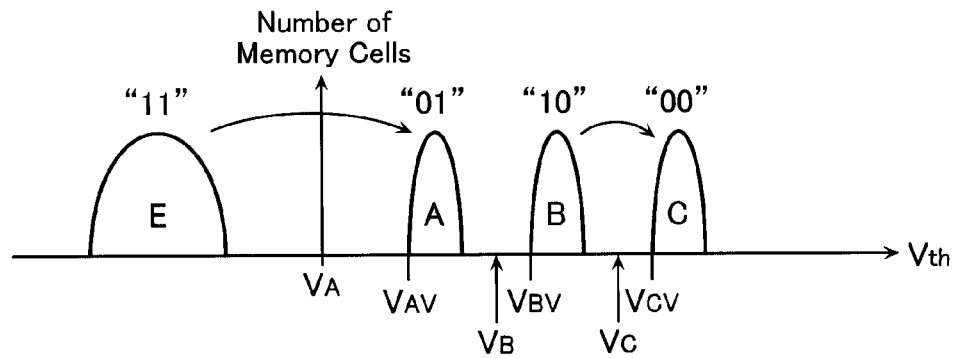
FIG. 5 is a conceptual diagram showing a data writing procedure of a four-value storage type flash memory.

That is, as shown in FIG. 5, when the value of the upper page data is "1", the memory cells MC are protected so that a high electrical field is not applied to their tunnel oxide film and their threshold voltage Vth does not rise. As a result, the memory cells MC having the data "11" (threshold voltage distribution E representing the erased state) maintain the data "11", and the memory cells MC having the data "10" (threshold voltage distribution B') maintain the data "10". It should be noted, however, that the lower limit value of the threshold voltage distribution B' should be adjusted by using the regular verify voltage VBV higher than the above-mentioned verify voltage VBV' to thereby narrow the width of the threshold voltage distribution B' and form the threshold voltage distribution B.

On the other hand, when the value of the upper page data is "0", a high electrical field is applied to the tunnel oxide film of the memory cells MC to inject electrons into the floating gate electrode and raise the threshold voltage Vth of the memory cells MC by a certain amount. As a result, the memory cells MC having the data "11" (threshold voltage distribution E representing the erased state) are changed to data "01" having the threshold voltage distribution A, and the memory cells MC having the data "10" are changed to data "00" having the threshold voltage distribution C. At this time, the verify voltages VAV and VCV are used to adjust the lower limit values of the threshold voltage distributions A and C.

The above is one example of the data writing scheme of the nonvolatile semiconductor memory device according to the comparative example, and the memory cells MC store two-bit data per cell by being given any of the threshold voltage distribution E representing the erased state and the three threshold voltage distributions A, B, and C. A multi-bit storing scheme for storing three bits or more executes basically the same operation as above, because it only additionally includes an operation of dividing the memory cells into eight threshold voltage distributions in accordance with the upper page data.

Writing into the memory cells MC is executed on the basis of the aggregate P shown in FIG. 2. That is, all the memory cells MC connected to one word line WL are written simultaneously. Next, a writing method on the basis of an aggregate P will be explained with reference to the flowchart shown in FIG. 6A. This writing method is one example, and the present invention is not limited to the writing method shown in FIG. 6A. From a viewpoint of preventing erroneous writing, in one memory string MS, writing is executed in an order from the memory cell MC16 closest to the source line SRC, and finally in the memory cell MC1 farthest from the source line SRC.

Figure 6A:
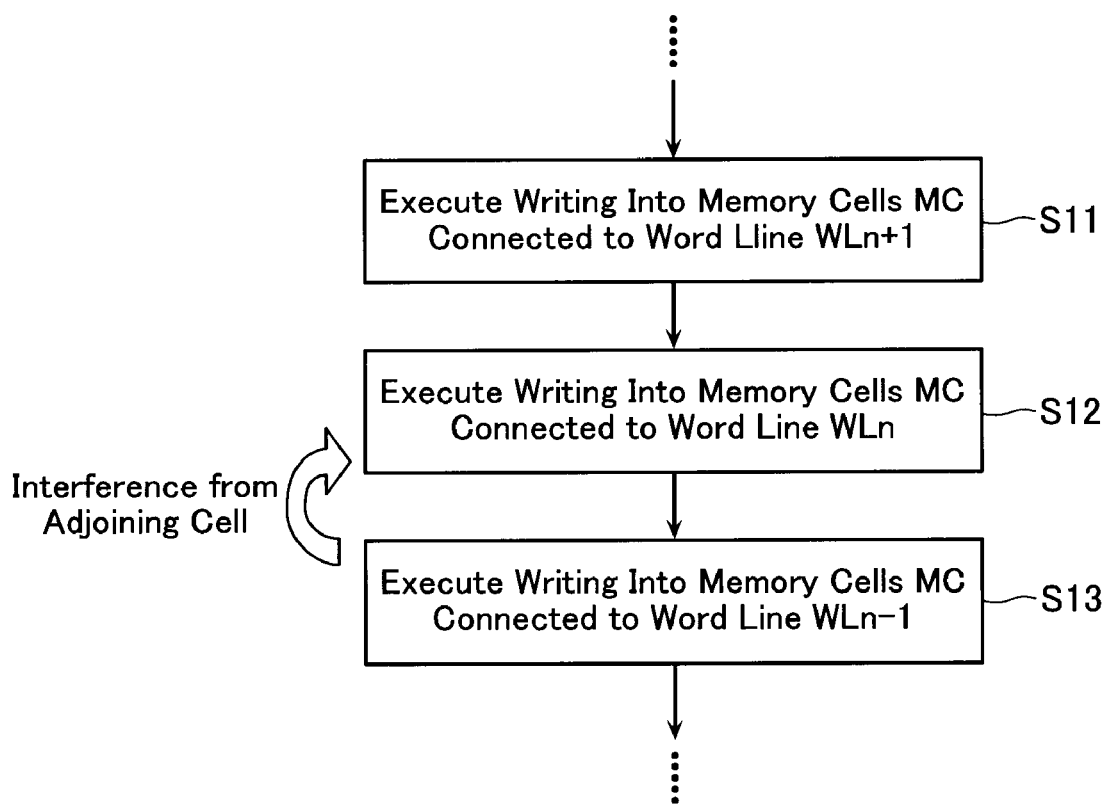
FIG. 6A is a flowchart showing a data writing procedure according to a comparative example.

As described above, writing into the memory cells MC is executed on the basis of an aggregate P. For example, as shown in FIG. 6A, the memory cells MC connected to the word line WLn+1 are written simultaneously (step S11). Next, the memory cells MC connected to the word line WLn are written simultaneously. (step S12). Then, the memory cells MC connected to the word line WLn−1 are written simultaneously (step S13). Here, the threshold voltages of the memory cells MC fluctuates in accordance with the amount of charges stored in the memory cells MC in an adjoining aggregate P. That is, the threshold voltages of the memory cells MC connected to the word line WLn fluctuates in accordance with the amount of charges stored in the memory cells MC connected to the word line WLn+1. This phenomenon is referred to as interference from an adjoining cell. This phenomenon becomes more noticeable as the interval between the memory cells MC becomes shorter.

The threshold voltage distributions shown in FIG. 5 might fluctuate even after a writing operation into a cell is completed, due to interference from an adjoining cell. For example, consider a case when the data retained in a memory cell MCa is to be set to data "01" and the data retained in the surrounding memory cells MCb is to be set to data "00", as shown in "a" of FIG. 6B. In this case, the memory cell MCa is written with the threshold voltage distribution A while all the memory cells MCb are written with the threshold voltage distribution C. As a result, the memory cell MCa is greatly influenced by interference from the adjoining cells due to the charges stored in the surrounding memory cells MCb. Hence, the threshold voltages of the memory cell MCa greatly shifts to a positive direction.

Figure 6B:
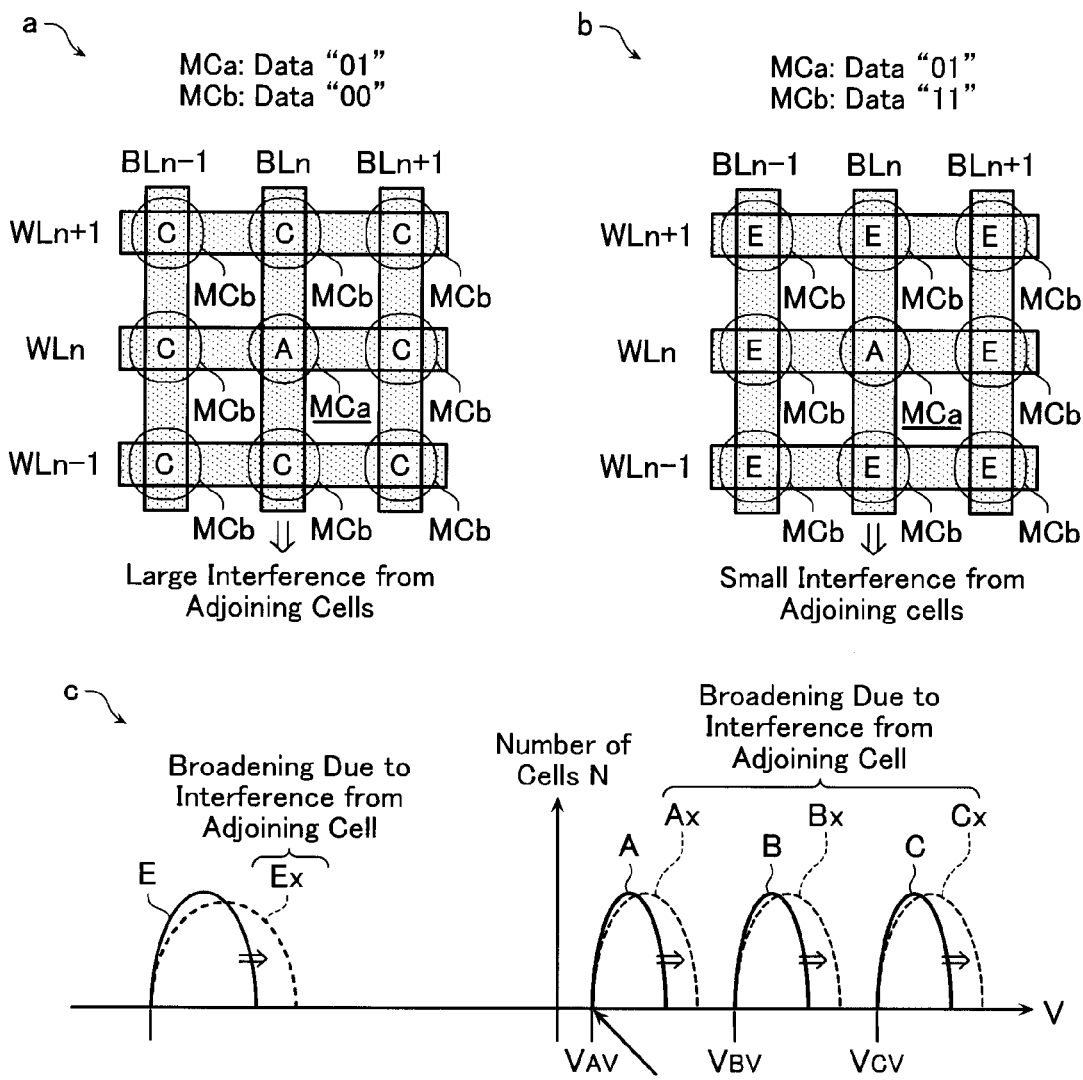
FIG. 6B is an explanatory diagram explaining influence of interference from adjoining cells according to a comparative example.

On the other hand, consider a case when the data retained in the memory cell MCa is to be set to data "01" (threshold voltage distribution A) and the data retained in the surrounding memory cells MCb is to be set to data "11" (threshold voltage distribution E), as shown in "b" of FIG. 6B. In this case, the memory cell MCa is written with the threshold voltage distribution A while all the memory cells MCb are maintained in the threshold voltage distribution E. Therefore, since no high voltage is applied to the surrounding memory cells MCb, the memory cell MCa is barely influenced by interference from the adjoining cells. Therefore, the threshold voltages of the memory cell MCa hardly shifts, unlike in the example shown in "a" of FIG. 6B.

In this way, the threshold voltages of the memory cell MCa greatly fluctuates when the adjoining memory cells MCb are written with data "01", "10", and "00" (written state) (greater fluctuation is caused by higher threshold voltage distributions (i.e., C>B>A)). On the other hand, the threshold voltages of the memory cell MCa hardly fluctuates when the data in the adjoining memory cells MCb are maintained to data "11" (erased state). Here, there are many memory cells MC in the memory cell array 1. That is, there exist such retained-data patterns as shown in "a" and "b" of FIG. 6B in the memory cell array 1 in a mixed state. Therefore, there exist memory cells MC to cause a larger threshold shift and memory cells MC to cause a smaller threshold shift in a mixed state.

Hence, as shown in "c" of FIG. 6B, the threshold voltage distribution A of the memory cell MCa becomes a threshold voltage distribution Ax having a greater width of distribution due to interference from the adjoining memory cells MCb, while the lower limit value of the threshold voltage distribution Ax is nevertheless hardly changed from that of the original threshold voltage distribution A. (as indicated by an arrow shown in "c" of FIG. 6B). For the same reason, the threshold voltage distributions B and C become threshold voltage distributions Bx and Cx having a greater width of distribution respectively, and the lower limit values of the threshold voltage distributions Bx and Cx are hardly changed from that of the original threshold voltage distributions B and C. Likewise, the threshold voltage distribution E becomes a threshold voltage distribution Ex having a greater width of distribution, and the lower limit value thereof is hardly changed from that of the original threshold voltage distribution E. The threshold voltage distributions Ax, Bx, and Cx that have come to be spread over a greater width of distribution in this way become the cause of erroneous read, etc.

In view of the problem of the writing scheme according to the above-described comparative example, the first embodiment employs a writing scheme shown in FIG. 7A, FIG. 7B, FIG. 8A, and FIG. 8B. The process to be described below is executed by the control circuit 7.

Figure 7A:
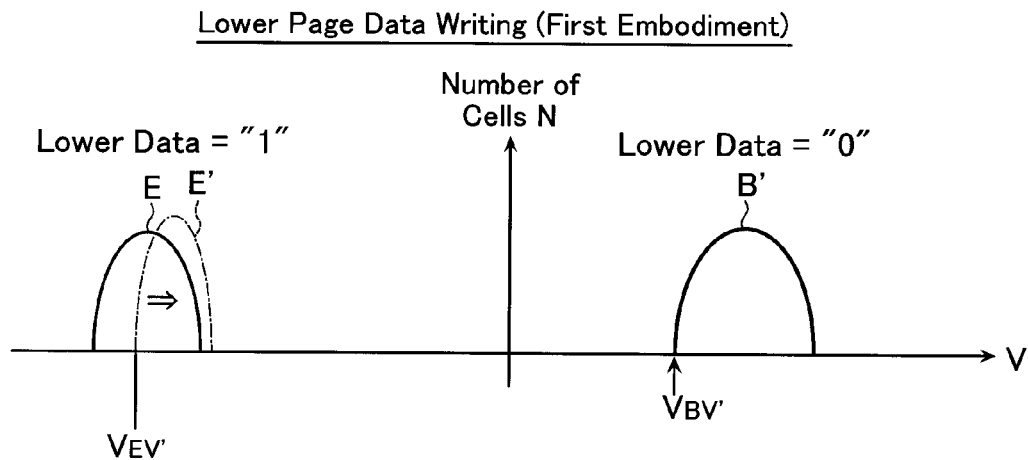
FIG. 7A is a conceptual diagram showing a data writing procedure according to the first embodiment.

The first embodiment is the same as the comparative example (FIG. 4 and FIG. 5) in that lower page data writing and upper page data writing are executed in this order. However, according to the present embodiment, as shown in FIG. 7A, the lower page data writing is executed by applying a writing voltage even when the value of the lower page data is "1", in order to move the threshold voltage distribution E to the positive direction to obtain the threshold voltage distribution E'. In this point, the present embodiment is different from the comparative example which maintains the threshold voltage distribution E as it is when the value of the lower page data is "1". The lower limit value of the threshold voltage distribution E' is adjusted by using a verify voltage VEV'. The verify voltage VEV' is set based on the threshold voltage distributions A, B, and C and the threshold voltage distributions Ax, Bx, and Cx shown in "c" of FIG. 6B. That is, when memory cells MCj connected to a word line WLj is to be maintained in the erased state, a verify voltage VEV' is applied to the word line WLj. When the word line WLj adjoins the word line WLj' connected to memory cells MCj', the value of the verify voltage VEV' is determined based on the amount of fluctuation of the threshold voltage distribution A, B, and C in the memory cell MCj'. Note that the amount of charges stored in memory cells MC to be maintained in the erased stage need not correctly correspond to the amount of fluctuation of the threshold voltage distributions A, B, and C. Even in this case, a remarkable effect can be achieved as compared with the conventional example.

As long as it is possible to correct the amount of fluctuation of the threshold voltage distributions A, B, and C, it is unnecessary to correct the amount of charges by using the verify voltage VEV'. As a result, it becomes possible to simplify the circuit operation. Further, in the lower page data writing, it is possible to skip applying the writing voltage to the memory cells to be written with "1" as the lower page data, but to adjust the amount of charges only by a verify operation. As a result, it becomes possible to simplify the circuit operation. That is, it is only necessary to store charges enough to compensate for the amount of fluctuation of the threshold voltage distributions A, B, and C in the memory cells MC that are to retain the data "1".

Figure 7B:
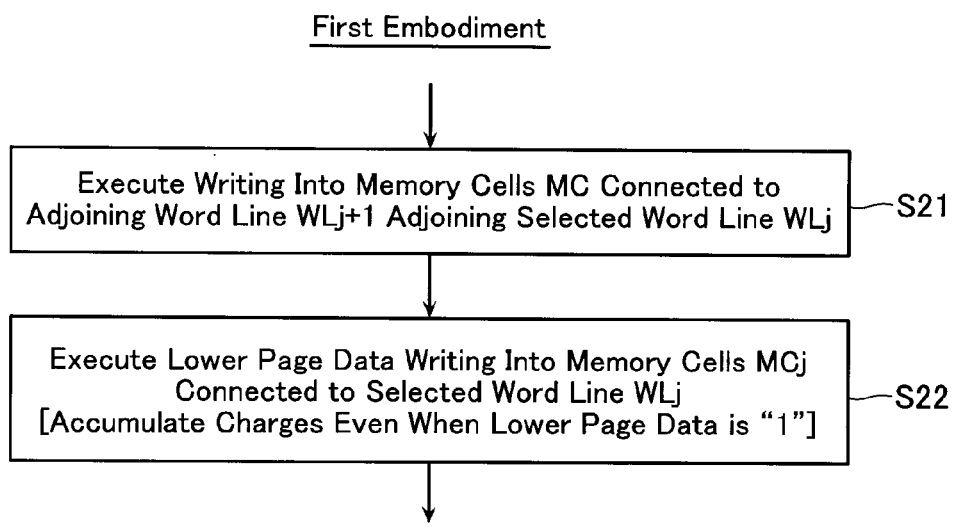
FIG. 7B is a flowchart showing a data writing procedure according to the first embodiment.

The above lower page data writing is executed as shown in FIG. 7B, for example. As shown in FIG. 7B, a writing operation is executed simultaneously in the memory cells MC connected to an adjoining word line WLj−1 adjoining a selected word line WL (step S21). Then, a lower page data writing operation is executed simultaneously in the memory cells MCj connected to the selected word line WLj (step S22). In step S22, charges are accumulated also in the memory cells MC to be written with the value "1" as the lower page data.

Figure 8A:
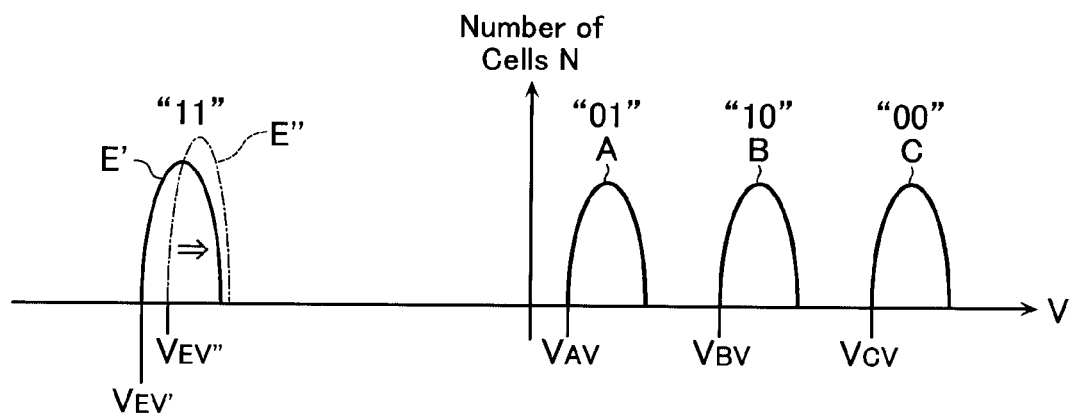
FIG. 8A is a conceptual diagram showing a data writing procedure according to the first embodiment.

Further, according to the present embodiment, as shown in FIG. 8A, the upper page data writing is executed by applying the writing voltage even when the value of the lower page data is "1" and the value of the upper page data is "1", in order to move the threshold voltage distribution E' to the positive direction (in order to further store charges) to obtain a threshold voltage distribution E". In this point, the present embodiment is different from the comparative example which maintains the threshold voltage distribution E as it is when the value of the lower page data is "1" and the value of the upper page data is "1". The lower limit value of the threshold voltage distribution E" is adjusted by using a verify voltage VEV". The verify voltage VEV" is applied to the word line WLj connected to the memory cells MCj to be maintained in the erased stage. The voltage VEV" is determined based on the amount of fluctuation of the threshold voltage distributions A, B, and C of the memory cells MCj' connected to the word line WLj' adjoining the word line WLj. Note that the amount of charges stored in memory cells MC to be maintained in the erased stage need not correctly correspond to the amount of fluctuation of the threshold voltage distributions A, B, and C. Even in this case, a remarkable effect can be achieved as compared with the conventional example.

As long as it is possible to correct the amount of fluctuation of the threshold voltage distributions A, B, and C, it is unnecessary to apply the verify voltage VEV". As a result, it becomes possible to simplify the circuit operation. Further, in the upper page data writing, it is possible to skip applying the writing voltage to the memory cells MC that are to retain the data "11", but to apply only the verify voltage. As a result, it becomes possible to simplify the circuit operation. That is, it is only necessary to store charges enough to compensate for the amount of fluctuation of the threshold voltage distributions A, B, and C in the memory cells MC that are to retain the data "11".

Figure 8B:
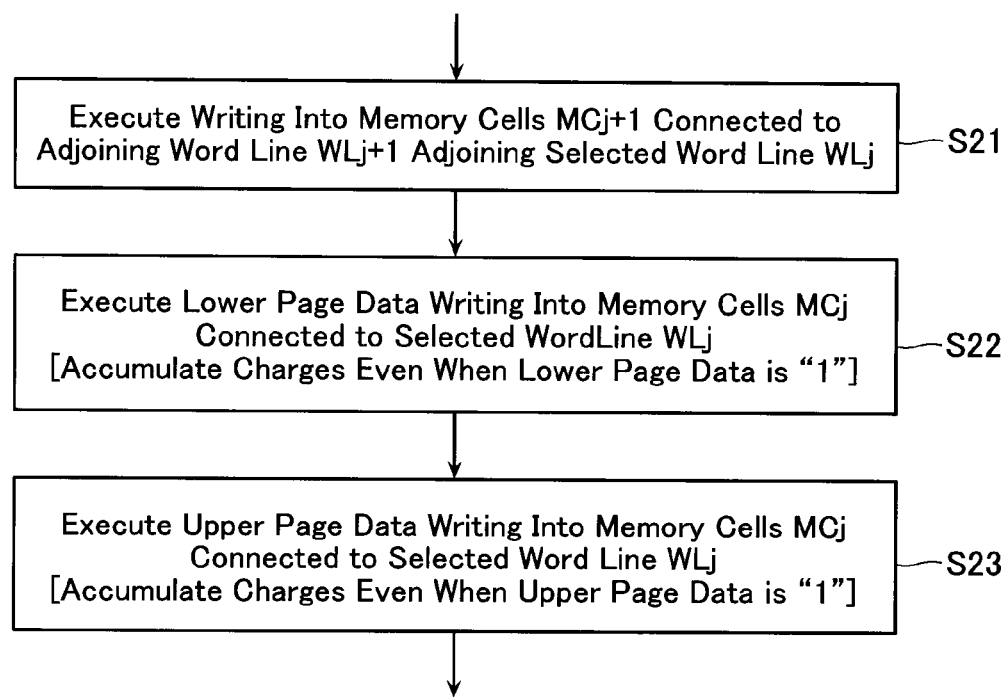
FIG. 8B is a flowchart showing a data writing procedure according to the first embodiment.

The above upper page data writing is executed as shown in FIG. 8B, for example. As shown in FIG. 8B, after the same steps S21 and S22 as those shown in FIG. 7B, an upper page data writing operation is executed simultaneously in the memory cells MC connected to the selected word line WL (step S23). In step S23, charges are accumulated also in the memory cells MC to be written with the value "1" as the upper page data. Between step S22 and step S23, writing into the memory cells MC connected to another word line WL may be executed.

In the upper page data writing, the amount of move of the threshold voltage distributions A and C is small. This is because normally, the threshold voltage distribution A is written by raising the threshold voltage distribution E' which is written when the lower page data is "1", and the threshold voltage distribution C is written by raising the threshold voltage distribution B' which is written when the lower page data is "0". That is, the amount of fluctuation of the threshold voltage distributions A, B, and C of the memory cells MC connected to the adjoining word line WL is smaller in the upper page data writing than in the lower page data writing. Accordingly, the amount of charges stored in the memory cells MC to be maintained in the erased state in the upper page data writing may bee set smaller than that in the lower page data writing. This allows the power consumption to be reduced. Further, in the lower page data writing, the verify voltage VEV' may be set to a lager value in order to increase the amount of fluctuation of the threshold voltage distributions A, B, and C of the memory cells MC. In this case, however, the upper limit value of the threshold voltage distribution E" obtained when the upper page data writing is completed can become 0V or lower, if the difference between the verify voltage VEV' and the verify voltage VEV" is set small.

The operation shown in FIG. 7 and FIG. 8 of moving the threshold voltage distribution E representing the erased state to the positive direction is referred to as an erased state correcting operation. The erased state correcting operation in the first embodiment is executed at the same time as writing the threshold voltage distributions A, B, and C in the plurality of memory cells MC formed along one word line WL. That is, the operation speed is substantially the same as in the comparative example.

The threshold voltage distributions according to the first embodiment might fluctuate even after a writing operation in a cell is completed, due to interference from an adjoining cell, like in the comparative example. However, according to the first embodiment, the width of the threshold voltage distributions can be made narrower than that of the comparative example by the erased state correcting operation. The advantage of the first embodiment will now be specifically explained with reference to FIG. 9. For example, consider a case when the data to be retained in the memory cell MCa is data "01", and the data to be retained in the surrounding memory cells MCb is data "00", as shown in "a" of FIG. 9. In this case, writing is executed such that the threshold voltages of the memory cell MCa is included in the threshold voltage distribution A, and the threshold voltages of all the memory cells MCb is included in the threshold voltage distribution C. As a result, the threshold voltage distribution A of the memory cell MCa greatly shifts to the positive direction for the same reason as in the comparative example.

Figure 9:
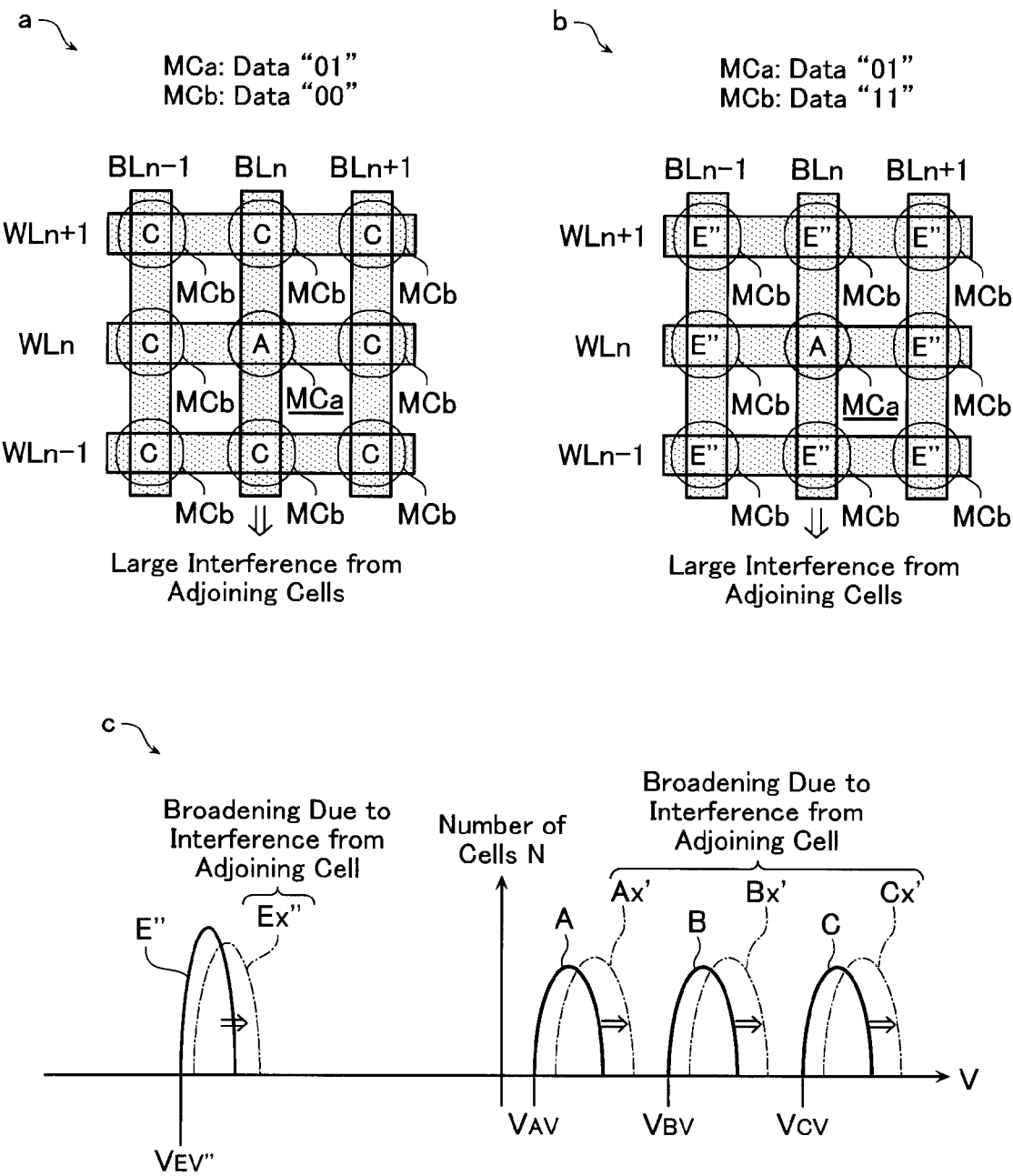
FIG. 9 is an explanatory diagram explaining influence of interference from adjoining cells according to the first embodiment.

On the other hand, consider a case when the data to be retained in the memory cell MCa is data "01", and the data to be retained in the surrounding memory cells MCb is data "11", as shown in "b" of FIG. 9. In this case, unlike in the comparative example, the memory cell MCa is written with the threshold voltage distribution A, and all the memory cells MCb are written with the threshold voltage distribution E". As a result, the memory cell MCa is influenced by interference from the adjoining cells in accordance with the amount of charges stored in the surrounding memory cells MCb. Therefore, the threshold voltage distribution A of the memory cell MCa shifts to the positive direction like in the example shown in "a" of FIG. 9.

In this way, the threshold voltage distribution of the memory cell MCa greatly fluctuates to the positive direction when the adjoining memory cells MCb are written with data "01", "10", and "00" (written state). The threshold voltage distribution of the memory cell MCa also fluctuates to the positive direction when the adjoining memory cells MCb are maintained to the data "11" (erased state). Hence, the threshold voltage distribution A of the memory cell MCa moves to the positive direction to become the threshold voltage distribution Ax' due to interference from the adjoining memory cells MCb, as shown in "c" of FIG. 9. However, since the upper limit value and lower limit value of the threshold voltage distribution Ax' are the values obtained by moving the upper limit value and lower limit value of the original threshold voltage distribution A to the positive direction respectively, the width of distribution of the threshold voltage distribution Ax' can become narrower than the width of distribution of the threshold voltage distribution Ax of the comparative example. For the same reason, the threshold voltage distributions B and C move to the positive direction and become the threshold voltage distributions Bx' and Cx' respectively. However, the width of distribution of the threshold voltage distributions Bx' and Cx' can become narrower than the width of distribution of the threshold voltage distributions Bx and Cx of the comparative example. That is, it is possible to say that the threshold voltage distributions obtained by performing parallel shift of the threshold voltage distributions A, B, and C to the positive direction are the threshold voltage distributions Ax', Bx', and Cx'. Further, the threshold voltage distribution E" moves to the positive direction and becomes the threshold voltage distribution Ex'. The width of distribution of the threshold voltage distribution Ex" can become narrower than the width of distribution of the threshold voltage distribution Ex of the comparative example.

As described above, according to the first embodiment, it is possible to suppress erroneous read, etc., because it is possible to make the width of distribution of the threshold voltage distributions influenced by interference from an adjoining cell narrower than in the comparative example.

[Second Embodiment]

Next, a nonvolatile semiconductor memory device according to the second embodiment will be explained with reference to FIG. 10. The second embodiment is different from the first embodiment in that a writing operation is executed in two states including a foggy writing process for writing upper page data and lower page data coarsely, and a fine writing process for writing upper page data and lower page data accurately. In each of the foggy writing process and the fine writing process, the threshold voltage distribution representing the erased state is moved to the positive direction by the erased state correcting operation. Thereby, the second embodiment can obtain the same advantage as the first embodiment.

A writing process according to a four-value storage scheme involving the foggy writing process and the fine writing process will be explained with reference to FIG. 10. First, from a state ("a" of FIG. 10) after all the memory cells MC have been erased, the foggy writing process ("b" of FIG. 10) is executed in given memory cells MC. As shown in FIG. 10, the foggy writing process is a writing process for obtaining threshold voltage distributions Efo, Afo, Bfo, and Cfo, by using verify voltages VEVfo, VAVfo, VBVfo, and VCVfo lower than the lower limit values of the threshold voltage distributions E, A, B, and C, which are the final target distributions to be achieved. Here, when memory cells MCj connected to a word line WLj is to be maintained in the erased state, a verify voltage VEVfo is applied to the word line WLj. When the word line WLj adjoins the word line WLj' connected to memory cells MCj', the value of the verify voltage VEVfo is determined based on the amount of fluctuation of the threshold voltage distribution A, B, and C in the memory cell MCj'.

As long as it is possible to correct the amount of fluctuation of the threshold voltage distributions A, B, and C, it is unnecessary to correct the amount of charges by using the verify voltage VEVfo. As a result, it becomes possible to simplify the circuit operation. Further, in the foggy writing process, it is possible to skip applying the writing voltage to the memory cells MC to be maintained in the erased state, but to adjust the amount of charges only by a verify operation. As a result, it becomes possible to simplify the circuit operation. That is, it is only necessary to store charges in the memory cells to be maintained in the erased state such that the amount of fluctuation of the threshold voltage distributions A, B, and C is compensated.

When charges are accumulated in an adjoining memory cell MC, the above-described interference from an adjoining memory cell occurs. As a result, the threshold voltage distributions Efo, Afo, Bfo, and Cfo resulting from the foggy writing process shift to the positive direction to become the threshold voltage distributions Efox, Afox, Bfox, and Cfox ("c" of FIG. 10), respectively. The foggy writing process is a coarse writing process, and the difference between the verify voltages VEVfo, VAVfo, VBVfo, and VCVfo is set smaller than the difference between the verify voltages VEV, VAV, VBV, and VCV of the fine writing process. Therefore, for example, due to interference from an adjoining cell, the threshold voltage distributions Efo, Afo, Bfo, and Cfo fluctuate and become the threshold voltage distributions Efox, Afox, Bfox, and Cfox overlapping each other.

Figure 10:
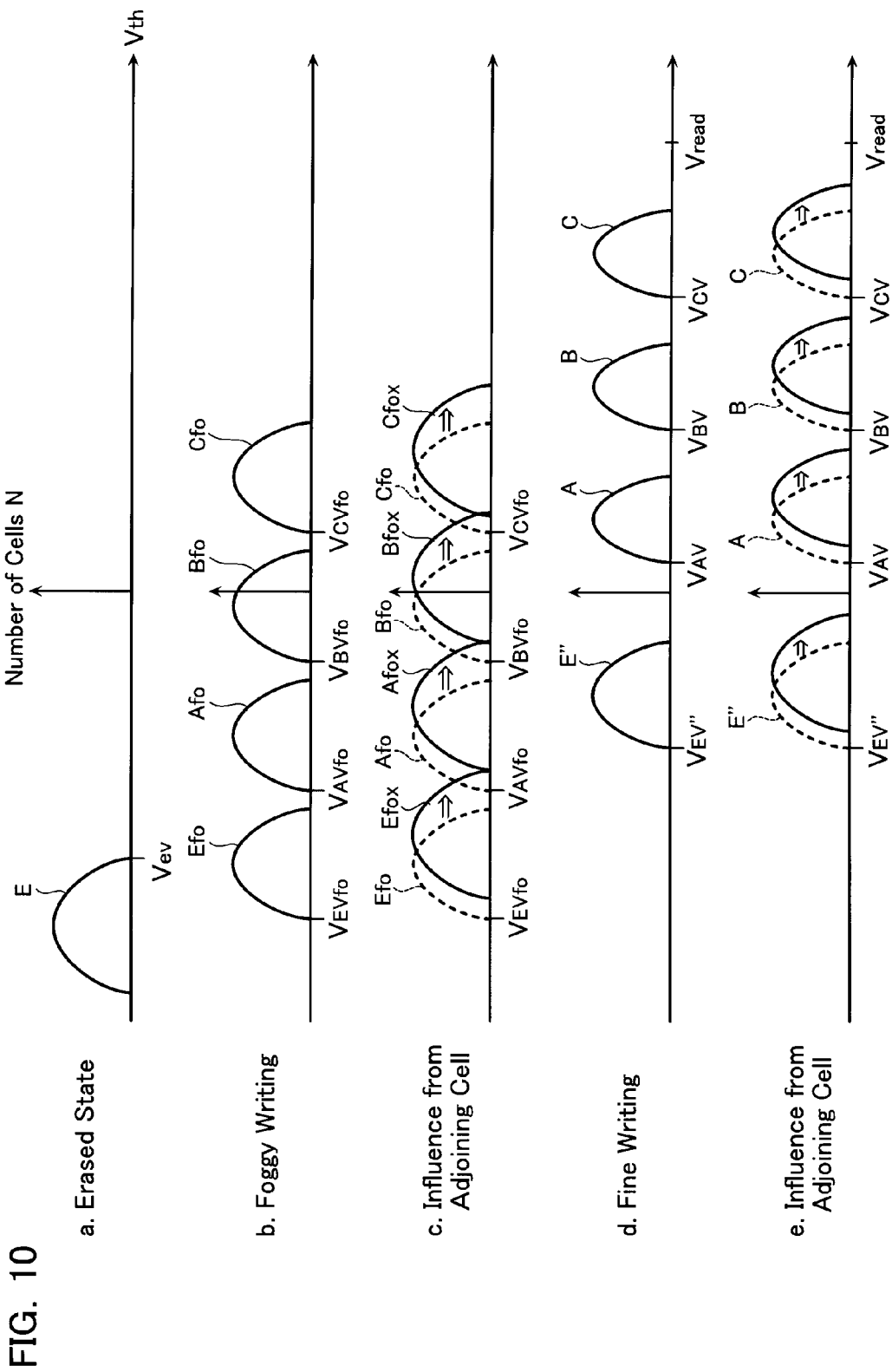
FIG. 10 is a conceptual diagram showing a data writing scheme of a nonvolatile semiconductor memory device according to a second embodiment.

After this, the fine writing process is executed in the memory cells MC ("d" of FIG. 10). In the fine writing process, after lower page data writing (Efox→B), upper page data writing (Efox→A, B→C) and the erased state correcting operation (Efox→E") are executed like in the first embodiment. The fine writing process achieves the plurality of threshold voltage distributions E", A, B, and C, which are the final targets to obtain, by moving the threshold voltage distributions Efox, Afox, Bfox, and Cfox to the positive direction by using verify voltages VEV", VAV, VBV, and VCV equal to the lower limit values of the threshold voltage distributions E", A, B, and C. Also the fine writing process uses the verify voltage VEV" to move the threshold voltage distribution Efox to the positive direction. The verify voltage VEV" is a negative value (an equivalently negative value) like the verify voltage VEVfo used in the foggy writing process, but a value higher than the verify voltage VEVfo (i.e., has a smaller absolute value).

As long as it is possible to correct the amount of fluctuation of the threshold voltage distributions A, B, and C, it is unnecessary to correct the amount of charges by using the verify voltage VEV". As a result, it becomes possible to simplify the circuit operation. Further, in the fine writing process, it is possible to skip applying the writing voltage to the memory cells MC to be maintained in the erased state, but to adjust the amount of charges only by a verify operation. As a result, it becomes possible to simplify the circuit operation. That is, it is only necessary to store charges enough to compensate for the amount of fluctuation of the threshold voltage distributions A, B, and C in the memory cells MC to be maintained in the erased state.

Even after the fine writing process, the threshold voltage distributions E", A, B, and C fluctuate to a certain degree due to interference from adjoining cells ("e" of FIG. 10). However, it is possible to suppress the amount of fluctuation by manipulating the writing procedure, etc.

Next, one example of the writing procedure for suppressing the fluctuation of the threshold voltage distributions will be explained with reference to FIG. 11. Like in the first embodiment, in one memory string MS, writing is executed in an order from the memory cell MC16 closest to the source line SRC, and finally in the memory cell MC1 farthest from the source line SRC.

Figure 11:
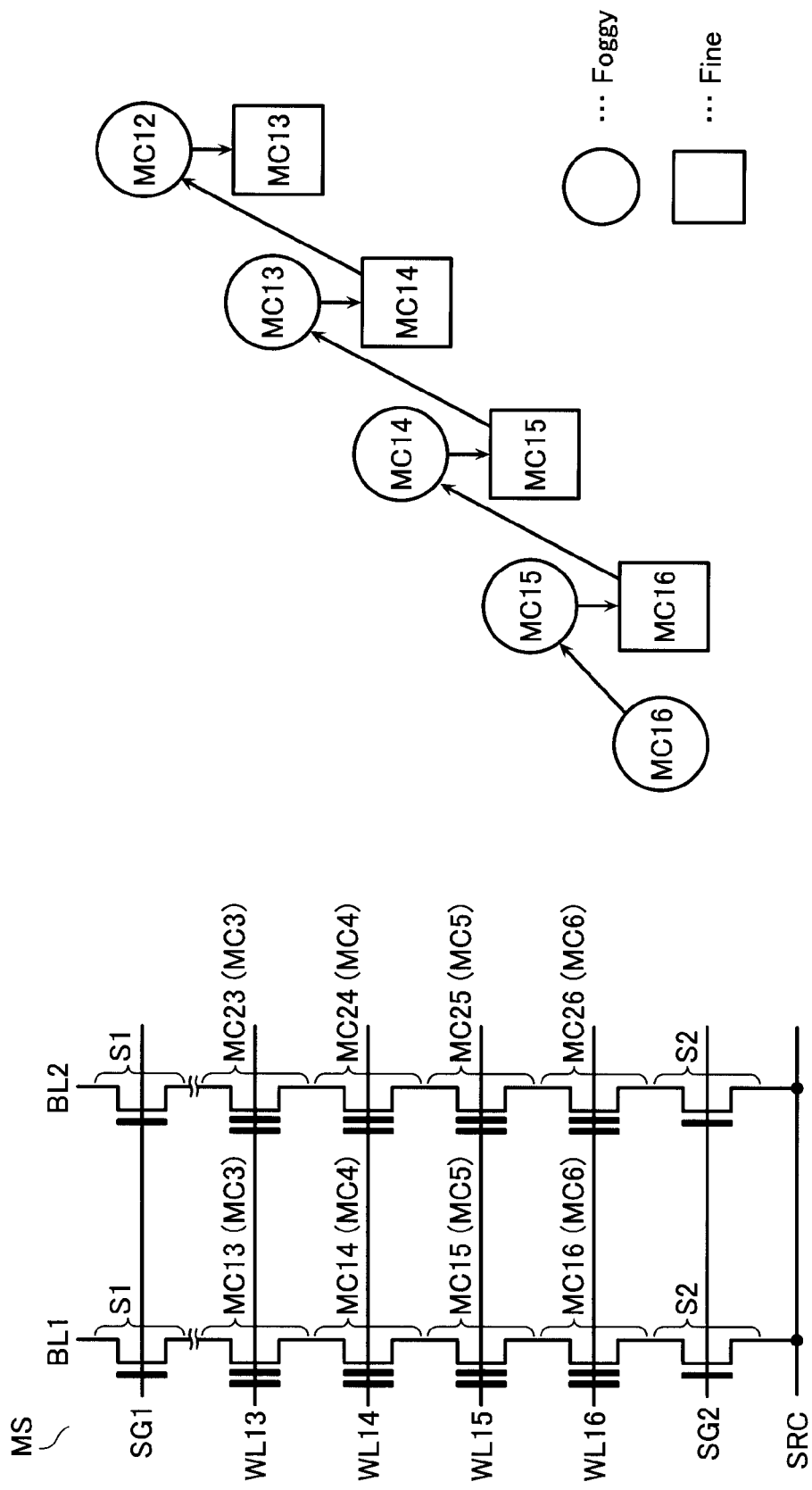
FIG. 11 is a conceptual diagram showing a procedure of a data writing method according to the second embodiment.

When executing the foggy writing process and fine writing process described above in the memory string MS, executing such a writing process as shown in FIG. 11 may suppress fluctuation of the threshold voltage distributions to the minimum. First, the foggy writing process is executed in the memory cells MC 16 and MC26 closest to the source line SRC (hereinafter, all the memory cells MC connected to the word line WL16 will be referred to as memory cells MC6 generically). Then, the foggy writing process is executed in the adjoining memory cells MC15 and MC25 (hereinafter, all the memory cells MC connected to the word line WL15 will be referred to as memory cells MC5 generically).

Here, when the foggy writing process is executed in the memory cells MC5, the threshold voltage distributions of the memory cells MC6 shift to the positive direction. However, in the foggy writing process in the memory cells MC5, the erased state correcting operation is executed. That is, since the threshold voltage distributions of the memory cells MC6 undergo a substantially parallel shift to the positive direction, the width thereof does not broaden. On the other hand, since the foggy writing process in the memory cells MC5 is before writing is executed in the memory cells MC14 and MC24 (hereinafter, all the memory cells MC connected to the word line WL14 will be referred to as memory cells MC4 generically), the threshold voltage distributions of the memory cells MC4 receive no influence.

After the foggy writing process is executed in the memory cells MC5, the fine writing process is executed back in the memory cells MC6. When the fine writing process is executed in the memory cells MC6, the threshold voltage distributions of the memory cells MC5 shift to the positive direction. However, in the fine writing process in the memory cells MC6, the erased state correcting operation is executed. That is, since the threshold voltage distributions of the memory cells MC5 undergo a substantially parallel shift, the width thereof does not broaden.

In the next step, the process target is not the memory cells MC5 adjoining the memory cells MC6, but the memory cells MC4 away from the memory cells MC6 in the direction of the bit line BL by two cells, and the foggy writing process is executed therein. Since the memory cells MC5 are sandwiched between the memory cells MC4 and the memory cells MC6, fluctuation of the threshold voltage distributions of the memory cells MC6 is suppressed. On the other hand, the threshold voltage distributions of the memory cells MC5 shift to the positive direction when the foggy writing process is executed in the memory cells MC4. However, in the foggy writing process in the memory cells MC4, the erased state correcting operation is executed. That is, since the threshold voltage distributions of the memory cells MC5 undergo a substantially parallel shift to the positive direction, the width thereof does not broaden.

Next, the fine writing process is executed in the memory cells MC5. When the fine writing process is executed in the memory cells MC5, the threshold voltage distributions of the memory cells MC6 and MC4 shift to the positive direction. However, in the fine writing process in the memory cells MC5, the erased state correcting operation is executed. That is, since the threshold voltage distributions of the memory cells MC6 and MC4 undergo a substantially parallel shift to the positive direction, the width thereof does not broaden.

After this, likewise, the procedure of executing the foggy writing process in the memory cells MCn−2 away in the direction of the bit line BL by two cells from the memory cells MCn (n being a natural number) in which the fine writing process has been completed, and then returning by one cell to the memory cells MCn−1 to execute the fine writing process therein is repeated down to the memory cells MC1. This enables to suppress influence to be given on adjoining memory cells MC to the minimum in the memory cell array 1 in which the foggy/fine writing processes are executed.

Since the amount of threshold fluctuation in adjoining memory cells MC is smaller in the fine writing process than in the foggy writing process, it is possible to skip the erased state correcting operation in the fine writing process. As a result, it becomes possible to suppress the electricity to be consumed.

[Third Embodiment]

Next, a memory cell array 1 of a nonvolatile semiconductor memory device according to the third embodiment will be explained. The erased state correcting operation according to the embodiments described above is executed when giving the threshold voltage distributions A, B, and C to a plurality of memory cells MC formed along one word line WL. As compared with this, the erased state correcting operation according to the third embodiment is executed after the operation of writing the threshold voltage distributions A, B, and C in the memory cell array 1 is completed, and in this correcting operation, a voltage is applied selectively to the memory cells MC given the threshold voltage distribution E. The third embodiment is different from the embodiments described above in this point.

Figure 12:
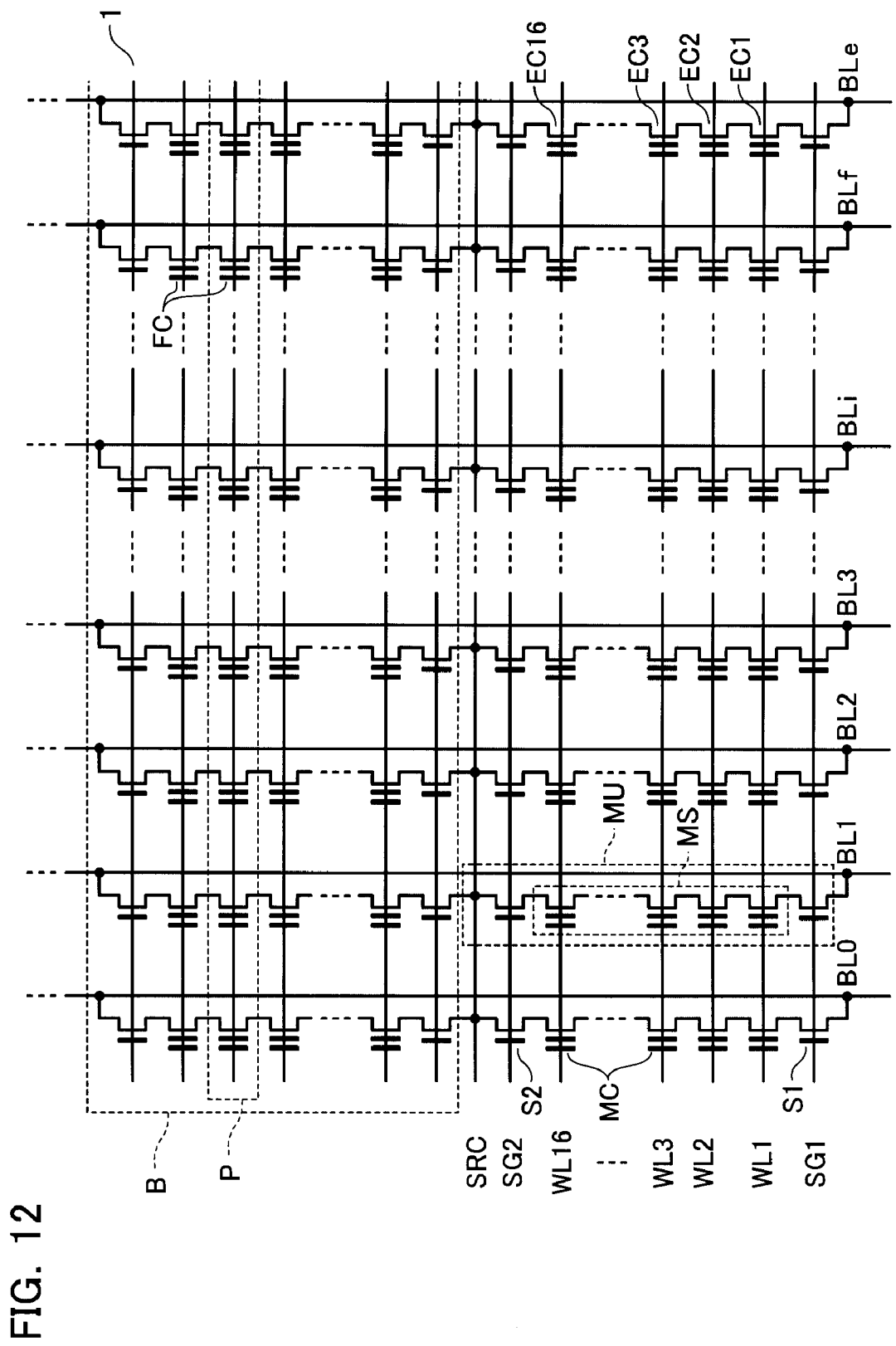
FIG. 12 is a circuit diagram showing a configuration of a memory cell array 1 according to a third embodiment.

First, the configuration of the memory cell array 1 according to the third embodiment will be explained with reference to FIG. 12. As shown in FIG. 12, the memory cell array 1 according to the third embodiment includes cells EC1 to EC16 having control gates connected to the word lines WL1 to WL16 respectively. The cells EC1 to EC16 retain data representing whether the erased state correcting operation has been completed or not. For example, when the erased state correcting operation for the plurality of memory cells MC connected to the word lines WL1 to WL16 has been completed, the cells EC1 to EC16 retain data "0". When the erased state correcting operation for the plurality of memory cells MC connected to the word lines WL1 to WL16 has not been completed, the cells E1 to E16 retain data "1".

Figure 13:
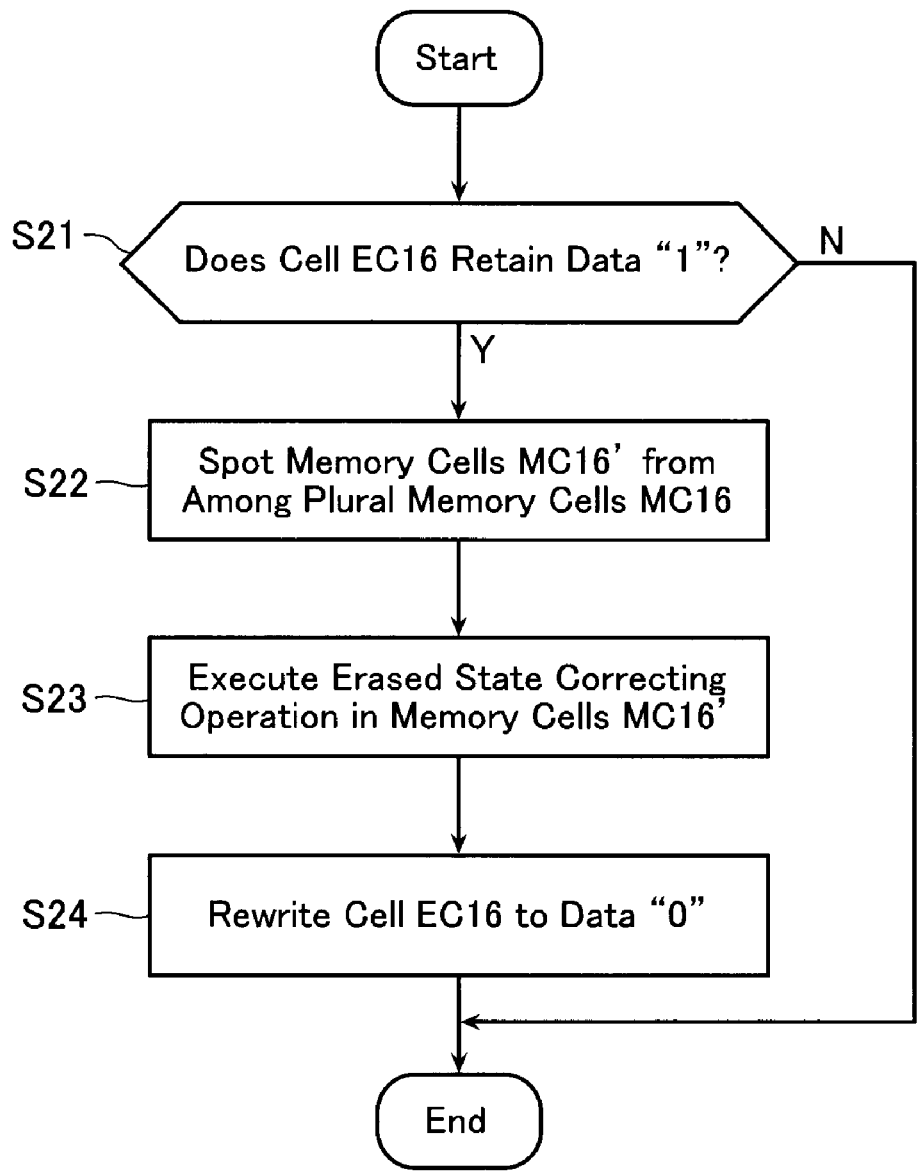
FIG. 13 is a flowchart diagram showing a procedure of a data writing method according to the third embodiment.

Next, the erased state correcting operation of the nonvolatile semiconductor memory device according to the third embodiment will be explained with reference to FIG. 13. As an example, FIG. 13 shows the erased state correcting operation for the plurality of memory cells MC formed along the word line WL16. Here, it is assumed that before shifting to the process shown in FIG. 13, the selected memory cells MC in the memory cell array 1 have already been written to the written states (threshold voltage distributions A, B, and C) by lower page data writing and upper page data writing.

As shown in FIG. 13, first, it is determined whether the cell EC16 formed along the word line WL16 retains data "1" or not (step S21). When it is determined that the cell EC16 retains data "1" (step S21, Y), memory cells MC16' given the threshold voltage distribution E are specified from among the plurality of memory cells MC16 formed along the word line WL16 (step S22). Next, the erased state correcting operation is executed in the spotted memory cells MC16' (step S23). Then, the data in the cell EC16 is rewritten from data "1" to data "0" (step S24). After step S24, the erased state correcting operation for the plurality of memory cells MC is completed. The process shown in FIG. 13 is executed in the same manner in the other memory cells MC1 to MC15 than the memory cells MC16 formed along the word line WL16.

According to the third embodiment described above, the erased state correcting operation is executed after the operation of writing the threshold voltage distributions A, B, and C in the memory cell array 1 is completed. Therefore, when there is enough time between the completion of the operation of writing the threshold voltage distributions A, B, and C in the memory cell array 1 and the read operation, the erased state correcting operation can be executed during this time. Further, by executing the erased state correcting operation by a so-called background job, it is substantially possible to avoid slowing down the operation speed. Furthermore, the information representing whether the erased state correcting operation has been executed or not is retained by the cells EC1 to EC16. Therefore, even if the erased state correcting operation is interrupted in the middle of execution, it can be resumed from where it was interrupted.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, although the embodiments described above have explained a nonvolatile semiconductor memory device of a four-value storage scheme (two bits per cell), the present invention is not limited to this, but needless to say, can be applied to a multi-bit storage scheme such as an eight-value storage scheme.

According to the third embodiment, the execution state of the erased state correcting operation for, for example, the memory cells MC16 is written in the cell EC16. However, the present invention may be such that the execution state of the erased state correcting operation for other memory cells MC than the memory cells MC16 is stored in the cell EC16.

The above-described fluctuation of the threshold voltage distributions due to interference from adjoining cells occurs not only in memory cells (floating gate type memory cells) having a floating gate electrode (conductive body) but also in charge trap type memory cells. Charge trap type memory cells have an insulating film (dielectric body) capable of accumulating charges, instead of a floating gate electrode. Therefore, the embodiments described above may be applied to charge trap type memory cells. An insulating film capable of accumulating charges includes, for example, a silicon nitride film, a silicon oxynitride film, and in addition, a metal oxide film, etc.

Likewise, the above-described fluctuation of the threshold voltage distributions due to interference from adjoining cells occurs not only in a memory cell array arranged on a substrate two-dimensionally (conventional NAND type flash memory) but also in a memory cell array arranged on a substrate three-dimensionally. Therefore, the embodiments described above may be applied to memory cell arrays 1A and 1B shown in FIG. 14 and FIG. 15 arranged three-dimensionally.

Figure 14:
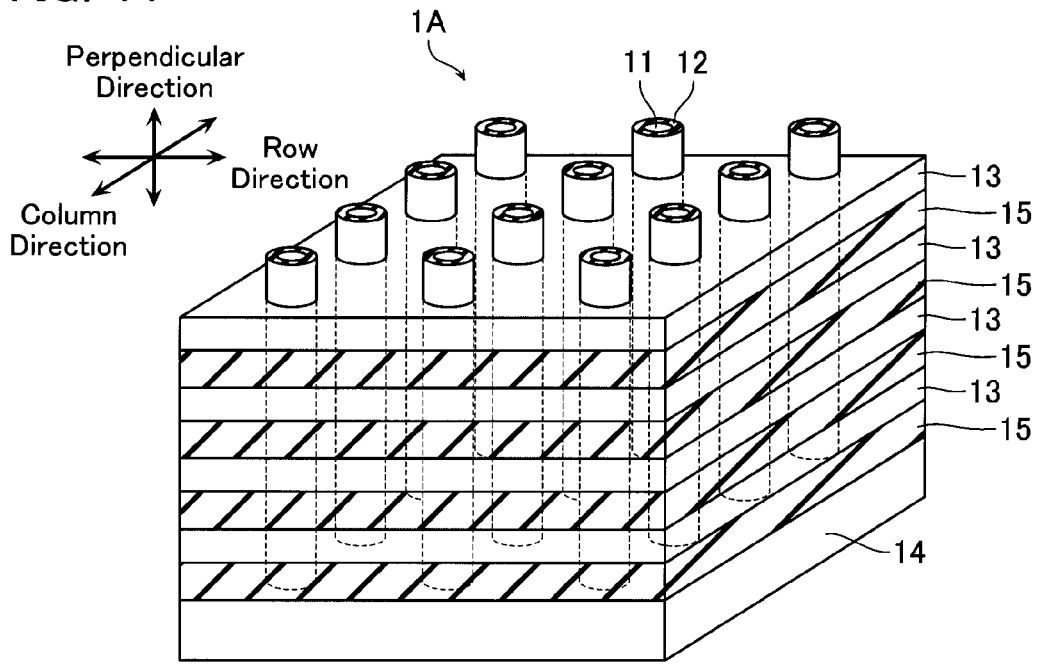
FIG. 14 is a schematic perspective diagram showing a memory cell array 1A according to another embodiment.

The memory cell array 1A shown in FIG. 14 includes semiconductor layers 11, memory gate insulating layers 12, and conductive layers 13.

The semiconductor layers 11 function as body (channel) of memory cells MC. The semiconductor layers 11 are formed in a columnar shape extending in a direction perpendicular to a substrate 14. The semiconductor layers 11 have a side surface spreading in the direction perpendicular to the substrate 14. The semiconductor layers 11 are arranged in a row direction and a column direction in a matrix formation. The semiconductor layers 11 are made of, for example, polysilicon.

The memory gate insulating layers 12 are capable of accumulating charges. The memory gate insulating layers 12 are formed to surround (cover) the side surface of the semiconductor layers 11. The memory gate insulating layers 12 are made of, for example, an ONO film (a film in which oxide silicon, nitride silicon, and oxide silicon are stacked).

The conductive layers 13 function as gate of the memory cells MC and as word line WL. The conductive layers 13 are stacked in the direction perpendicular to the substrate 14 with an insulating layer 15 interposed between them. The conductive layers 13 are formed in a plate shape spreading in directions parallel with the substrate 14 (in the row direction and in the column direction). The conductive layers 13 are formed to surround (cover) the side surface of the semiconductor layers 11 through the memory gate insulating layers 12. The conductive layers 13 are made of, for example, polysilicon.

Figure 15:
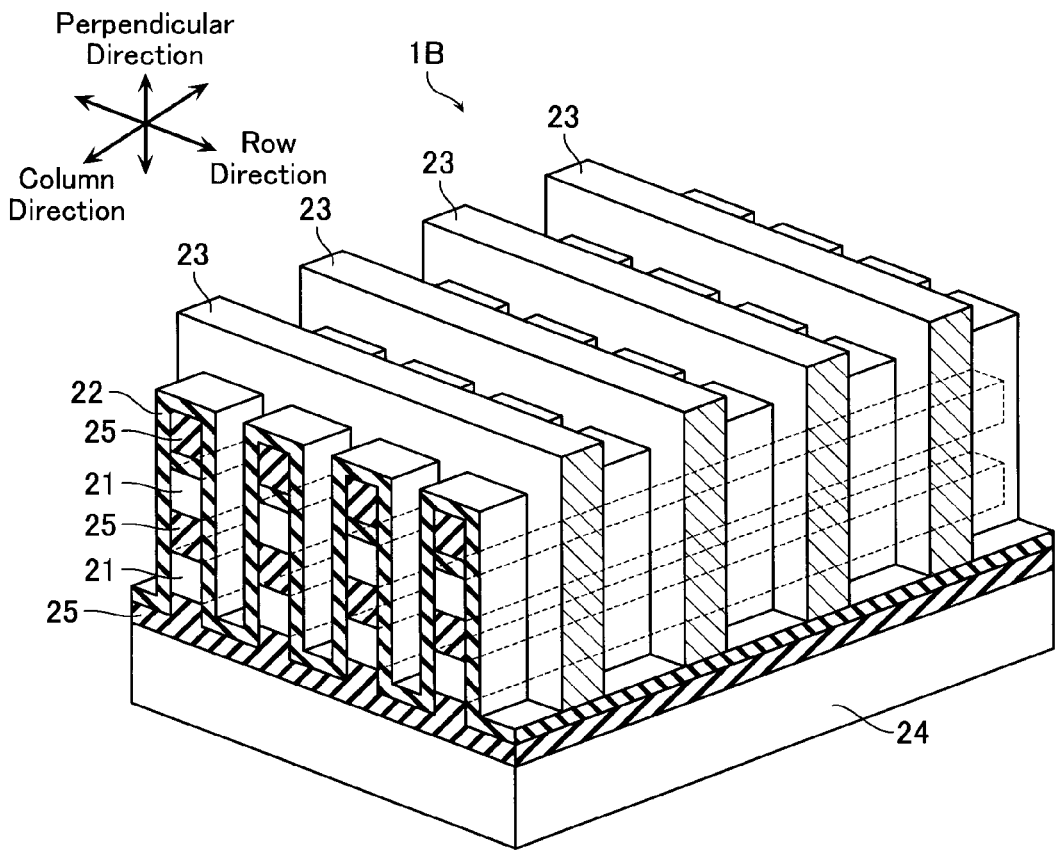
FIG. 15 is a schematic perspective diagram showing a memory cell array 1B according to yet another embodiment.

The memory cell array 1B shown in FIG. 15 includes semiconductor layers 21, a memory gate insulating layer 22, and conductive layers 23.

The semiconductor layers 21 function as body (channel) of memory cells MC. The semiconductor layers 21 extend in a column direction with a certain pitch secured between them in a row direction. The semiconductor layers 21 have a side surface spreading in a direction perpendicular to a substrate 24. The semiconductor layers 21 are stacked in the direction perpendicular to the substrate 24 with an insulating layer 25 interposed between them. The semiconductor layers 21 are made of, for example, polysilicon.

The memory gate insulating layer 22 is capable of accumulating charges. The memory gate insulating layer 22 is formed to cover the side surface of the semiconductor layers 21. The memory gate insulating layer 22 is made of, for example, an ONO film.

The conductive layers 23 function as gate of the memory cells MC and as word line WL. The conductive layers 23 cover the side surface of the semiconductor layers 21 through the memory gate insulating layer 22, and extend in the row direction with a certain pitch secured between them in the column direction.

What is claimed is:

1. A nonvolatile semiconductor memory device, comprising:

a memory cell array configured by a plurality of memory strings each including memory cells connected in series, the memory cells being capable of storing data by retaining a first threshold voltage distribution having a negative upper limit value and representing an erased state after data is erased, and a second threshold voltage distribution having a lower limit value higher than the upper limit value of the first threshold voltage distribution and representing a written state after data is written;

a plurality of word lines each provided to be connected commonly to the memory cells in the plurality of memory strings;

a plurality of bit lines connected to first ends of the memory strings respectively;

a source line connected to second ends of the memory strings; and a control circuit configured to control the memory cells through the word lines, the bit lines, and the source line, the control circuit being configured to, in executing a writing operation for giving the second threshold voltage distribution to a plurality of memory cells formed along one word line, perform a writing operation by executing a voltage applying operation in memory cells to be given the second threshold voltage distribution, while executing a voltage applying operation in memory cells to be maintained in the erased state, thereby moving the first threshold voltage distribution in a positive direction to obtain a third threshold voltage distribution representing the erased state, wherein the control circuit is configured to execute, in memory cells to be given the second threshold voltage distribution, a foggy writing process for moving a threshold voltage distribution in a positive direction using a first verify voltage lower than the lower limit value of the second threshold voltage distribution, the control circuit is configured to execute, in memory cells to be given the second threshold voltage distribution, a fine writing process for moving a threshold voltage distribution after the foggy writing process further in a positive direction using a second verify voltage equal to the lower limit value of the second threshold voltage distribution, in the foggy writing process, the control circuit moves a threshold voltage distribution of memory cells to be maintained in the erased state in a positive direction using a third verify voltage lower than a lower limit value of the third threshold voltage distribution, and in the fine writing process, the control circuit moves a threshold voltage distribution of the memory cells to be maintained in the erased state after the foggy writing process further in a positive direction by using a fourth verify voltage equal to the lower limit value of the third threshold voltage distribution.

2. The nonvolatile semiconductor memory device according to claim 1, wherein the control circuit obtains the third threshold voltage distribution in the memory cells based on an amount of fluctuation of the second threshold voltage distribution of memory cells connected to a word line adjoining a word line connected to the memory cells to be maintained in the erased state.

3. The nonvolatile semiconductor memory device according to claim 1,
wherein the memory cell array includes:
first transistors provided between the first ends of the memory strings and the bit lines; and
second transistors provided between the second ends of the memory strings and the source line.

4. The nonvolatile semiconductor memory device according to claim 1,
wherein the memory cell array is divided into a plurality of blocks, and
the control circuit is configured to erase data in the memory cells on a basis of each of the blocks.

5. A nonvolatile semiconductor memory device comprising:
a memory cell array configured by a plurality of memory strings each including memory cells connected in series, the memory cells being capable of storing data by retaining a first threshold voltage distribution having a negative upper limit value and representing an erased state after data is erased, and a second threshold voltage distribution having a lower limit value higher than the upper limit value of the first threshold voltage distribution and representing a written state after data is written;
a plurality of word lines each provided to be connected commonly to the memory cells in the plurality of memory strings;
a plurality of bit lines connected to first ends of the memory strings respectively;
a source line connected to second ends of the memory strings; and
a control circuit configured to control the memory cells through the word lines, the bit lines, and the source line,
the control circuit being configured to, in executing a writing operation for giving the second threshold voltage distribution to a plurality of memory cells formed along one word line, perform a writing operation by executing a voltage applying operation in memory cells to be given the second threshold voltage distribution, while executing a voltage applying operation in memory cells to be maintained in the erased state, thereby moving the first threshold voltage distribution in a positive direction to obtain a third threshold voltage distribution representing the erased state,
wherein the memory cell array includes:
a semiconductor layer having a side surface spreading in a direction perpendicular to a substrate and functioning as a body of the memory cells;
a memory gate insulating layer covering the side surface of the semiconductor layers and capable of accumulating charges; and
conductive layers covering the side surface of the semiconductor layer through the memory gate insulating layer and functioning as a gate of the memory cells.

6. The nonvolatile semiconductor memory device according to claim 5,
wherein the semiconductor layer extends in the direction perpendicular to the substrate, and
the conductive layers spread in directions parallel with the substrate.

7. The nonvolatile semiconductor memory device according to claim 5,
wherein the semiconductor layer extends in a second direction with a certain pitch in a first direction orthogonal to the second direction and parallel with the substrate, and the conductive layers extend in the first direction with a certain pitch secured between them in the second direction.

8. A nonvolatile semiconductor memory device, comprising:
a memory cell array configured by a plurality of memory strings each including memory cells connected in series, the memory cells being capable of storing data by retaining a first threshold voltage distribution having a negative upper limit value and representing an erased state after data is erased, and a second threshold voltage distribution having a lower limit value higher than the upper limit value of the first threshold voltage distribution and representing a written state after data is written;
a plurality of word lines each provided to be connected commonly to the memory cells in the plurality of memory strings;
a plurality of bit lines connected to first ends of the memory strings respectively;
a source line connected to second ends of the memory strings; and
a control circuit configured to control the memory cells through the word lines, the bit lines, and the source line, the control circuit being configured to, after completing an operation for writing the second threshold voltage distribution in the memory cell array, perform a control of executing a voltage applying operation selectively in memory cells given the first threshold voltage distribution, thereby moving the first threshold voltage distribution in memory cells to be maintained in the erased state in a positive direction to obtain a third threshold voltage distribution representing the erased state,
wherein the memory cell array includes:
a semiconductor layer having a side surface spreading in a direction perpendicular to a substrate and functioning as a body of the memory cells;
a memory gate insulating layer covering the side surface of the semiconductor layers and capable of accumulating charges; and
conductive layers covering the side surface of the semiconductor layer through the memory gate insulating layer and functioning as a gate of the memory cells.

9. The nonvolatile semiconductor memory device according to claim 8,
wherein the memory cell array includes cells configured to store whether a process of moving the first threshold voltage distribution of the memory cells to be maintained in the erased state in a positive direction to obtain the third threshold voltage distribution has been executed or not.

10. The nonvolatile semiconductor memory device according to claim 8,
wherein the control circuit obtains the third threshold voltage distribution in the memory cells based on an amount of fluctuation of the second threshold voltage distribution of memory cells connected to a word line adjoining a word line connected to the memory cells to be maintained in the erased state.

11. The nonvolatile semiconductor memory device according to claim 8,
wherein the control circuit is configured to execute, in memory cells to be given the second threshold voltage distribution, a foggy writing process for moving a threshold voltage distribution in a positive direction using a first verify voltage lower than the lower limit value of the second threshold voltage distribution, the control circuit is configured to execute, in the memory cells to be given the second threshold voltage distribution, a fine writing process for moving a threshold voltage distribution after the foggy writing process further in a positive direction using a second verify voltage equal to the lower limit value of the second threshold voltage distribution, in the foggy writing process, the control circuit moves a threshold voltage distribution of memory cells to be maintained in the erased state in a positive direction using a third verify voltage lower than a lower limit value of the third threshold voltage distribution, and in the fine writing process, the control circuit moves a threshold voltage distribution of the memory cells to be maintained in the erased state after the foggy writing process further in a positive direction by using a fourth verify voltage equal to the lower limit value of the third threshold voltage distribution.

12. The nonvolatile semiconductor memory device according to claim 8, wherein the memory cell array includes:

first transistors provided between the first ends of the memory strings and the bit lines; and second transistors provided between the second ends of the memory strings and the source line.

13. The nonvolatile semiconductor memory device according to claim 8, wherein the memory cell array is divided into a plurality of blocks, and the control circuit is configured to erase data in the memory cells on a basis of each of the blocks.

14. The nonvolatile semiconductor memory device according to claim 8, wherein the semiconductor layer extends in the direction perpendicular to the substrate, and the conductive layers spread in directions parallel with the substrate.

15. The nonvolatile semiconductor memory device according to claim 8, wherein the semiconductor layer extends in a second direction with a certain pitch in a first direction orthogonal to the second direction and parallel with the substrate, and the conductive layers extend in the first direction with a certain pitch secured between them in the second direction.

16. A writing method of a nonvolatile semiconductor memory device, the nonvolatile semiconductor memory device comprising:

a memory cell array configured by a plurality of memory strings each including memory cells connected in series, the memory cells being capable of storing data by retaining a first threshold voltage distribution having a negative upper limit value and representing an erased state after data is erased, and a second threshold voltage distribution having a lower limit value higher than the upper limit value of the first threshold voltage distribution and representing a written state after data is written;

a plurality of word lines each provided to be connected commonly to the memory cells in the plurality of memory strings;

a plurality of bit lines connected to first ends of the memory strings respectively; and a source line connected to second ends of the memory strings, the method comprising:

in executing a writing operation for giving the second threshold voltage distribution to a plurality of memory cells formed along one word line, performing a writing operation by executing a voltage applying operation in memory cells to be given the second threshold voltage distribution, while executing a voltage applying operation in memory cells to be maintained in the erased state, thereby moving the first threshold voltage distribution in a positive direction to obtain a third threshold voltage distribution representing the erased state, executing, in memory cells to be given the second threshold voltage distribution, a foggy writing process for moving a threshold voltage distribution in a positive direction using a first verify voltage lower than the lower limit value of the second threshold voltage distribution;

executing, in memory cells to be given the second threshold voltage distribution, a fine writing process for moving a threshold voltage distribution after the foggy writing process further in a positive direction using a second verify voltage equal to the lower limit value of the second threshold voltage distribution;

in the foggy writing process, moving a threshold voltage distribution of the memory cells to be maintained in the erased state in a positive direction using a third verify voltage lower than a lower limit value of the third threshold voltage distribution; and in the fine writing process, moving a threshold voltage distribution of the memory cells to be maintained in the erased state after the foggy writing process further in a positive direction using a fourth verify voltage equal to the lower limit value of the third threshold voltage distribution.

17. The writing method of the nonvolatile semiconductor memory device according to claim 16, comprising obtaining the third threshold voltage distribution in the memory cells based on an amount of fluctuation of the second threshold voltage distribution of memory cells connected to a word line adjoining a word line connected to the memory cells to be maintained in the erased state.

* * * * *